(12) United States Patent
Chen et al.

(10) Patent No.: US 11,031,263 B2
(45) Date of Patent: Jun. 8, 2021

(54) LASER STRIPPING MASS-TRANSFER DEVICE AND METHOD FOR MICRODEVICES BASED ON WINDING PROCESS

(71) Applicant: HUAZHONG UNIVERSITY OF SCIENCE AND TECHNOLOGY, Hubei (CN)

(72) Inventors: Jiankui Chen, Hubei (CN); Yiwei Jin, Hubei (CN); Zhouping Yin, Hubei (CN); Yongan Huang, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 0 days.

(21) Appl. No.: 17/041,464

(22) PCT Filed: Jul. 1, 2019

(86) PCT No.: PCT/CN2019/094133
§ 371 (c)(1),
(2) Date: Sep. 25, 2020

(87) PCT Pub. No.: WO2020/042744
PCT Pub. Date: Mar. 5, 2020

(65) Prior Publication Data
US 2021/0013066 A1 Jan. 14, 2021

(30) Foreign Application Priority Data
Aug. 29, 2018 (CN) .......................... 201810991542.8

(51) Int. Cl.
*H01L 21/67* (2006.01)
*H01L 21/677* (2006.01)
*H01L 33/00* (2010.01)

(52) U.S. Cl.
CPC .. *H01L 21/67144* (2013.01); *H01L 21/67736* (2013.01); *H01L 33/0095* (2013.01)

(58) Field of Classification Search
CPC ......... H01L 21/67144; H01L 21/67173; H01L 21/67736; H01L 33/0095
See application file for complete search history.

(56) References Cited

U.S. PATENT DOCUMENTS

| | | | |
|---|---|---|---|
| 2004/0002227 A1* | 1/2004 | Shiozawa | H01L 21/6835 438/795 |
| 2020/0266317 A1* | 8/2020 | Bosman | H01L 31/0463 |
| 2020/0321310 A1* | 10/2020 | Kim | B23K 1/0016 |

FOREIGN PATENT DOCUMENTS

| | | |
|---|---|---|
| CN | 1275882 | 12/2000 |
| CN | 105070674 | 11/2015 |

(Continued)

OTHER PUBLICATIONS

"International Search Report (Form PCT/ISA/210)" of PCT/JP2019/094133, dated Oct. 10, 2019, pp. 1-4.

(Continued)

*Primary Examiner* — Mohammed Shamsuzzaman
(74) *Attorney, Agent, or Firm* — JCIP Global Inc.

(57) ABSTRACT

A laser stripping mass-transfer device includes a microdevice laser stripping transfer module, an auxiliary conveyor module, a transition conveyor module, a transfer conveyor module, a substrate carrier module, a microdevice filling module, a curing module, an encapsulation module and a substrate transportation module. The microdevice laser stripping transfer module is configured to implement detection and stripping of the microdevices. The auxiliary conveyor module is configured to adhere the stripped microdevices. The transition conveyor module is configured to pick up and transfer the microdevices to the transfer conveyor module. The transfer conveyor module is configured to pick (Continued)

up and transfer the microdevices to the substrate carrier module. The substrate carrier module is configured to feed the microdevices into the microdevice filling module, the curing module, the encapsulation module, and the substrate transportation module for filling, curing, encapsulating, loading and unloading.

9 Claims, 6 Drawing Sheets

(56) References Cited

FOREIGN PATENT DOCUMENTS

| | | |
|---|---|---|
| CN | 105762096 | 7/2016 |
| CN | 107068593 | 8/2017 |
| CN | 109244196 | 1/2019 |
| JP | H0621687 | 1/1994 |

OTHER PUBLICATIONS

"Written Opinion of the International Searching Authority (Form PCT/ISA/237)" of PCT/JP2019/094133, dated Oct. 10, 2019, pp. 1-5.

\* cited by examiner

LASER STRIPPING MASS-TRANSFER DEVICE AND METHOD FOR MICRODEVICES BASED ON WINDING PROCESS

CROSS-REFERENCE TO RELATED APPLICATION

This application is a 371 of international application of PCT application serial no. PCT/CN2019/094133, filed on Jul. 1, 2019, which claims the priority benefit of China application no. 201810991542.8, filed on Aug. 29, 2018. The entirety of each of the above mentioned patent applications is hereby incorporated by reference herein and made a part of this specification.

BACKGROUND

Technical Field

The disclosure relates to the field of semiconductor technology, and more specifically relates to a laser stripping mass-transfer device and method for microdevices based on a winding process.

Description of Related Art

The micro light-emitting diode (micro-LED) technology, that is, LED miniaturization and matrixisation technology, refers to the integration of high-density and micro-size LED arrays on a chip. For example, each pixel of an LED display may be addressed and individually driven to light up, which may be regarded as the miniature version of the LED display that reduces the pixel distance from millimeters to micrometers. The advantages of the micro-LED are obvious. The micro-LED inherits the characteristics such as the high efficiency, high brightness, high reliability, and fast response time of an inorganic LED. Also, the micro-LED has the characteristic of self-illumination without backlight, and has the advantages such as more energy saving, simple structure, small size, and thin. In addition, due to the extremely small size of the microdevice, the microdevice may very easily achieve ultra-high resolution, which may easily reach more than 1500 ppi. At the same time, compared with an organic light-emitting diode (OLED), the color accuracy is higher and has a longer lifespan and higher brightness.

During the manufacturing of the micro-LED display panel, first, the complementary metal-oxide-semiconductor (CMOS) integrated circuit manufacturing process is required to manufacture an LED display driving circuit. Then, the micro-LED is transported to the display driving circuit to form a micro-LED array. The existing chip-transfer technology generally adopts a robotic arm to pick up the chip and then transfer the chip to a target substrate, and one micro-LED display panel requires millions of micro-LED chips. Therefore, the traditional method is too inefficient and is unable to satisfy the requirements of the mass-transfer of microdevices during the manufacturing of the micro-LED display panel.

SUMMARY

In response to the above defects or improvement requirements of the prior art, the disclosure provides a laser stripping mass-transfer device and method for microdevices based on a winding process, which implement the mass-transfer of microdevices through the research and design of structures and specific assembly relationships of key components such as a microdevice stripping transfer module, an auxiliary conveyor module, a transition conveyor module, a transfer conveyor module, a substrate carrier module, a microdevice filling module, a curing module, an encapsulation module, and a substrate transportation module to utilize the winding process and laser stripping technology, thereby effectively improving the production efficiency and reducing the production cost.

In order to achieve the above objectives, according to one aspect of the disclosure, a laser stripping mass-transfer device includes a microdevice stripping transfer module, an auxiliary conveyor module, a transition conveyor module, a transfer conveyor module, a substrate carrier module, a microdevice filling module, a curing module, an encapsulation module and a substrate transportation module.

The microdevice stripping transfer module is located above the left side of the auxiliary conveyor module and is configured to implement the detection and stripping of microdevices.

The auxiliary conveyor module is configured to adhere the stripped microdevices, evenly arrange the stripped microdevices, and then transfer the stripped microdevices onto the transition conveyor module.

The transition conveyor module is located above the right side of the auxiliary conveyor module and is configured to continuously pick up the microdevices from the auxiliary conveyor module and transfer the microdevices onto the transfer conveyor module.

The transfer conveyor module is located on the right side of the transition conveyor module and is configured to continuously pick up the microdevices from the transition conveyor module and transfer the microdevices onto the substrate carrier module.

The substrate carrier module is located below the transfer conveyor module and is configured to receive the microdevices transferred from the transfer conveyor module and feed the microdevices into the microdevice filling module, the curing module and the encapsulation module in sequence.

The microdevice filling module, the curing module, the encapsulation module and the substrate transportation module are all disposed on a right side of the transfer conveyor module in sequence from left to right and are respectively configured for filling, curing, encapsulating, and loading and unloading.

As further preferred, the microdevice stripping transfer module includes an automatic wafer plate changing unit, a laser scan movement unit, a transfer laser scan unit, a transfer laser stripping unit, a wafer plate movement unit and a scan visual unit. The automatic wafer plate changing unit is arranged behind the wafer plate movement unit and is configured to install a wafer plate into a wafer plate tray above the wafer plate movement unit. The transfer laser scan unit and the transfer laser stripping unit are arranged above the wafer plate and are respectively configured to weaken the bonding strength between microdevices and the wafer plate and peel the microdevices from the wafer plate. The transfer laser scan unit is connected to the laser scan movement unit. The scan visual unit is located below the wafer plate and is configured to detect the quality of the microdevices and identify defective microdevices.

As further preferred, the auxiliary conveyor module includes an auxiliary unwinding roll, driven rollers, an idle roller, an auxiliary conveyor, an auxiliary visual unit, an auxiliary laser scan unit, an auxiliary laser stripping unit and an auxiliary winding roll. The auxiliary conveyor has two ends wound around the auxiliary unwinding roll and the auxiliary winding roll. A surface of the auxiliary conveyor has a glue layer to implement the stable adhesion of the microdevices. The auxiliary conveyor cooperates with the microdevice stripping transfer module, so that the microdevices are evenly arranged on the auxiliary conveyor. The auxiliary unwinding roll, the driven rollers, the idle roller, the auxiliary visual unit, the auxiliary laser scan unit, the auxiliary laser stripping unit and the auxiliary winding roll are arranged in sequence along the feeding direction of the auxiliary conveyor. The driven rollers are located on two sides of the auxiliary conveyor and are configured to drive the auxiliary conveyor to feed. The idle roller is located below the auxiliary conveyor and is configured to support the auxiliary conveyor and adjust the span layout of the auxiliary conveyor. The auxiliary visual unit is located above the auxiliary conveyor and is configured to detect the operating speed of the auxiliary conveyor. The auxiliary laser scan unit is located below the auxiliary conveyor and is configured to weaken the bonding strength between the microdevices and the auxiliary conveyor. The auxiliary laser stripping unit is located below the auxiliary conveyor and is configured to strip the microdevices from the auxiliary conveyor.

As further preferred, the transition conveyor module includes a transition unwinding roll, a transition winding roll, a transition roller disposed between the transition unwinding roll and the transition winding roll, a transition conveyor and a transition laser stripping unit. The transition conveyor bypasses the transition roller and has two ends wound around the transition unwinding roll and the transition winding roll. A surface of the transition conveyor has a glue layer. The transition laser stripping unit is disposed in the transition roller and is configured to emit laser, so as to implement the stripping of the microdevices from the transition conveyor. The cylindrical surface of the transition roller is designed with slits that allow the laser emitted by the transition laser stripping unit to pass therethrough. A lower part of the transition roller is adjacent to the auxiliary conveyor and a right side of the transition roller is adjacent to the transfer conveyor module to implement the continuous picking up of the microdevices from the auxiliary conveyor. Then, the microdevices are transferred onto the transfer conveyor module.

As further preferred, the transfer conveyor module includes a transfer unwinding roll, a transfer press roller, a transfer visual unit, a transfer idle roller, a transfer laser scan unit, a transfer laser stripping unit, a transfer conveyor and a transfer winding roll. The transfer conveyor has two ends wound around the transfer unwinding roll and the transfer winding roll. A surface of the transfer conveyor has a glue layer. The transfer unwinding roll, the transfer press roller, the transfer visual unit, the transfer idle roller, the transfer laser scan unit, the transfer laser stripping unit and the transfer winding roll are arranged in sequence along a feeding direction of the transfer conveyor. The transfer press roller is disposed above the transfer conveyor and is configured to adjust a spacing between the transition conveyor and the transfer conveyor, so as to implement the stable transfer of the microdevices from the transition conveyor to the transfer conveyor. The transfer visual unit is disposed below the transfer conveyor to detect the operating speed of the transfer conveyor. The transfer idle roller is disposed above the transfer conveyor and is configured to support the transfer conveyor and adjust the span layout of the transfer conveyor. The transfer laser scan unit is disposed above the transfer conveyor and is configured to weaken the bonding strength between the microdevices and the transfer conveyor. The transfer laser striping module is disposed above the transfer conveyor and is configured to implement the striping of the microdevices from the transfer conveyor.

As further preferred, the substrate carrier module includes an XYZ module, a substrate base, an adjustment component, a substrate support and a substrate visual unit. The substrate base is arranged on the XYZ module. The substrate support is connected to the substrate base through the adjustment component. A substrate is disposed on the substrate support and is configured to receive the microdevices stripped from the transfer conveyor. The substrate visual unit is disposed above the substrate and is configured to implement the consistency detection of a microdevice array attached onto the substrate.

As further preferred, the transfer laser unit of the microdevice stripping transfer module is preferred to simultaneously emit three independently controllable laser beams, which are respectively a first laser beam, a second laser beam, and a third laser beam. The three laser beams are distributed at equal interval being adjustable. The wafer plate is preferred to include a first wafer plate, a second wafer plate, and a third wafer plate. The three wafer plates are distributed at equal interval. The three independently controllable laser beams respectively act on the three wafer plates. The first wafer plate is installed with the first type microdevices. The second wafer plate is installed with the second type microdevices. The third wafer plate is installed with the third type microdevices. The three types of microdevices have the same size specifications. The first type microdevices, the second type microdevices, and the third type microdevices are respectively three types of microdevices. The three types of microdevices are transferred onto the auxiliary conveyor under the action of the laser beams and form an even-interval arrangement. The wafer plate tray is preferred to include a first wafer plate tray, a second wafer plate tray and a third wafer plate tray. The wafer plate movement unit is preferred to include a first wafer plate movement unit, a second wafer plate movement unit, and a third wafer plate movement unit. The three movement units all have independent degrees of freedom of XY movement in the plane.

As further preferred, the equal-interval arrangement of the first type microdevice, the second type microdevice, and the third type microdevice on the auxiliary conveyor is ensured through the following formula:

$$\frac{m}{v+\Delta v} + t/3 = Zt$$

where, m is a spacing between adjacent laser beams of the three independently controllable laser beams of the microdevice stripping transfer module, v is an actual speed of the auxiliary conveyor detected by the auxiliary visual unit, $\Delta v$ is an amount of speed fluctuation compensation of the auxiliary conveyor, t is a laser radiation interval of the transfer laser stripping unit, and Z represents an integer and a value thereof is $\lceil m/((v+\Delta v)t) \rceil$.

An uneven-interval distribution of the microdevices on the auxiliary conveyor is compensated through controlling the trigger delay of the first laser beam and the second laser beam, and the amount of delay is preferred to be obtained from the following formula:

$$\begin{cases} n = (v + \Delta v)t \\ \Delta ta = \dfrac{n/3 - (d + g)}{v + \Delta v} \\ \Delta tb = \dfrac{2n/3 - (2d + g + f)}{v + \Delta v} \end{cases}$$

where, n is a spacing between same type of microdevices, v is the actual speed of the auxiliary conveyor detected by the auxiliary visual unit, Δv is the amount of speed fluctuation compensation of the auxiliary conveyor, g is a spacing between the first type microdevice and the third type microdevice, f is a spacing between the first type microdevice and the second type microdevice, d is a width of the microdevice, Δta is an amount of delay of the first laser beam, Δtb is an amount of delay of the second laser beam, and t is the laser radiation interval of the transfer laser stripping unit.

As further preferred, the following formula is preferred to calculate the equal-interval spacing of each microdevice on the auxiliary conveyor:

$$s = \tfrac{1}{3}(v + \Delta v)t - d$$

where, s is the equal-interval spacing of each microdevice on the auxiliary conveyor, v is the actual speed of the auxiliary conveyor detected by the auxiliary visual unit, Δv is the amount of speed compensation of the auxiliary conveyor, t is the laser radiation interval of the transfer laser stripping unit, and d is the width of the microdevice.

The following formula is preferred to calculate the equal-interval spacing of each microdevice on the transition conveyor:

$$k = \dfrac{s + d}{v + \Delta v}(w + \Delta w) - d$$

where, k is a equal-interval spacing of each microdevice on the transition conveyor, s is the spacing of the equal-interval microdevices of the auxiliary conveyor, d is the width of the microdevice, v is the actual speed of the auxiliary conveyor detected by the auxiliary visual unit, Δv is the amount of speed compensation of the auxiliary conveyor, w is an actual speed of the transition conveyor, and Δw is an amount of speed compensation of the transition conveyor.

The following formula is preferred to calculate the equal-interval spacing of each microdevice on the transfer conveyor:

$$h = \dfrac{k + d}{w + \Delta w}(q + \Delta q) - d$$

where, h is an equal-interval spacing of each microdevice on the transfer conveyor, k is the equal-interval spacing of each microdevice on the transition conveyor, d is the width of the microdevice, q is a speed of the transfer conveyor detected by the transfer visual unit, Δq is an amount of speed compensation of the transfer conveyor, w is the actual speed of the transition conveyor, and Δw is the amount of speed compensation of the transition conveyor.

The following formula is preferred to calculate the equal-interval spacing of each microdevice on the substrate:

$$p = \dfrac{h + d}{q + \Delta q}(j + \Delta j) - d$$

where, p is an equal-interval spacing of each microdevice on the substrate, h is the equal-interval spacing of each microdevice on the transfer conveyor, d is the width of the microdevice, q is the speed of the transfer conveyor detected by the transfer visual unit, Δq is the amount of speed compensation of the transfer conveyor, j is an actual speed of the substrate detected by the substrate visual unit, and Δj is an amount of speed compensation of the substrate.

According to another aspect of the disclosure, a laser stripping mass-transfer method for a microdevice based on a winding process is provided, which is performed by adopting the laser stripping mass-transfer device for the microdevice based on the winding process and includes the following steps.

Step S1: setting the laser radiation interval t of the transfer laser stripping unit, the speed v of the auxiliary conveyor, the speed w of the transition conveyor, the speed q of the transfer conveyor, and the speed j of the substrate according to the required microdevice interval on the substrate, the transfer conveyor, the transition conveyor, and the auxiliary conveyor; and determining the spacing m of the laser beams according to the speed v of the auxiliary conveyor and the laser radiation interval t of the transfer laser stripping unit.

Step S2: installing the wafer plate into the wafer plate tray by the automatic wafer plate changing unit; and moving the wafer plate above the scan visual unit by the wafer plate movement unit to detect the quality of the microdevices and identify the defective microdevices.

Step S3: moving the wafer plate, so that the transfer laser scan unit laser scans the microdevices, weakening the bonding strength between the microdevices and the wafer plate through laser ablation to facilitate the transfer of the microdevices from the wafer plate; and emitting a point laser to act on the microdevices of the wafer plate by the transfer laser stripping unit, so that the microdevices are stripped from the wafer plate, transferred onto the auxiliary conveyor, and arranged into a single column with even layout.

Step S4: picking up the microdevices from the auxiliary conveyor by the transition conveyor, and picking up the microdevices from the transition conveyor by the transfer conveyor; continuously transferring the microdevices from the transfer conveyor to the substrate through the transfer laser unit, and controlling the substrate and the transfer conveyor to always move at the same speed by the substrate carrier module during the continuous transfer process; receiving the next column of microdevices after receiving a column of microdevices on the substrate and the substrate moves a distance; and repeating the process to form an arrayed microdevice pattern on the substrate.

Step S5: detecting the substrate through the substrate visual unit to determine whether there is a lack of microdevices on the substrate, and if so, filling the substrate by the microdevice filling module; implementing a reliable connection between the microdevices and the substrate using the curing module; then encapsulating a protective layer over the connected microdevices and substrate as a whole using the encapsulation module; and finally implementing the unloading of the substrate by the substrate transportation module.

In general, compared with the prior art, the above technical solutions conceived by the disclosure mainly have the following technical advantages.

1. The disclosure perfectly integrates the winding process and the laser stripping technology through designing the laser stripping mass-transfer for the microdevices to include the microdevice stripping transfer module, the auxiliary conveyor module, the transition conveyor module, the transfer conveyor module, the substrate carrier module, the microdevice filling module, the curing module, the encapsulation module, and the substrate transportation module, so as to implement the mass-transfer for the microdevices (chips) using the winding process and the laser stripping technology, which effectively improves the production efficiency and reduces the production cost.

2. The disclosure has specially researched and designed the specific structures and specific assembly relationships of various key components such as the microdevice stripping transfer module, the auxiliary conveyor module, the transition conveyor module, the transfer conveyor module, the substrate carrier module, the microdevice filling module, the curing module, the encapsulation module, and the substrate transportation module. The mass-transfer of microdevices is implemented through the mutual matching and cooperation of the various modules, which has the advantages of simple structure, convenient operation, strong applicability, etc.

3. The disclosure has also researched and designed the relationships between parameters such as the spacing between adjacent laser beams of the laser beams in the microdevice stripping transfer module, the actual speed of the auxiliary conveyor, the amount of speed fluctuation compensation of the auxiliary conveyor, and the laser radiation interval of the transfer laser stripping unit to ensure that the equal-interval arrangement of the microdevices on the auxiliary conveyor.

4. The disclosure also compensates the uneven distribution of the microdevices on the auxiliary conveyor through controlling the trigger delay of the first laser beam and the second laser beam, which further ensures the equal-interval arrangement of the microdevices on the auxiliary conveyor.

5. In addition, the disclosure also provides the specific calculation formulae for the equal-interval spacing of each microdevice on the auxiliary conveyor, the equal-interval spacing of each microdevice on the transition conveyor, the equal-interval spacing of each microdevice on the transfer conveyor, and the equal-interval spacing of each microdevice on the substrate to determine the operating speeds of each conveyor and the substrate according to the required microdevice interval and to ensure that the microdevices are distributed at equal interval on each conveyor and the substrate, which may be applied to a substrate that requires any microdevice spacing through reasonable parameter settings.

DETAILED DESCRIPTION OF DISCLOSED EMBODIMENTS

For the objectives, technical solutions, and advantages of the disclosure to be clearer, the disclosure is further described in detail below with reference to the accompanying drawings and the embodiments. It should be understood that the specific embodiments described here are only configured to explain the disclosure, but not to limit the disclosure. In addition, the technical features involved in the various embodiments of the disclosure described below may be combined with each other as long as there is no conflict therebetween.

Figure 1:
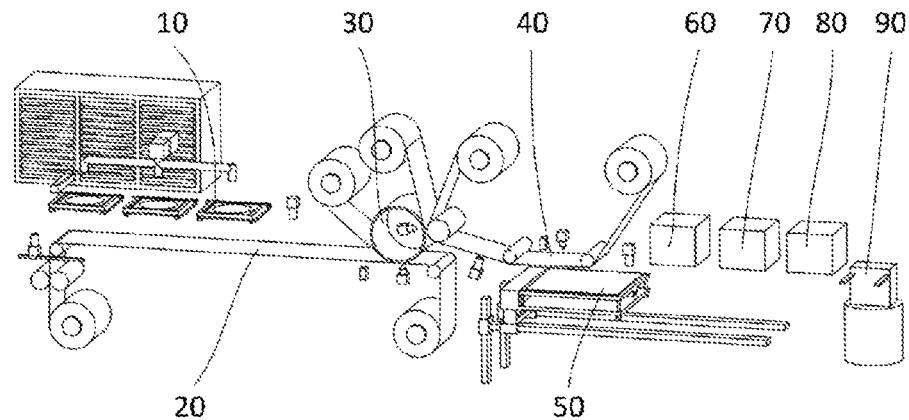
FIG. 1 is an overall structure diagram of a laser stripping mass-transfer device for a microdevice based on a winding process constructed according to a preferred embodiment of the disclosure.

As shown in FIG. 1, an embodiment of the disclosure provides a laser stripping mass-transfer device for a microdevice based on a winding process, which includes a microdevice stripping transfer module 10, an auxiliary conveyor module 20, a transition conveyor module 30, a transfer conveyor module 40, a substrate carrier module 50, a microdevice filling module 60, a curing module 70, an encapsulation module 80 and a substrate transportation module 90. The microdevice stripping transfer module 10 is located above the left side of the auxiliary conveyor module 20 and is configured to implement the detection of quality of the microdevices and the identification of defective microdevices, and to implement the stripping of functional microdevices. The auxiliary conveyor module 20 is configured to receive the microdevices stripped from the microdevice stripping transfer module 10 and transfer the microdevices onto the transition conveyor module 30. The transition conveyor module 30 is located above the right side of the auxiliary conveyor module 20 and is configured to continuously pick up the microdevices from the auxiliary conveyor module 20 and transfer the microdevices onto the transfer conveyor module 40. The transfer conveyor module 40 is located on the right side of the transition conveyor module 30 and is configured to continuously pick up the microdevices from the transition conveyor module 30 and transfer the microdevices onto the substrate carrier module 50. The substrate carrier module 50 is located below the transfer conveyor module 40 and is configured to receive the microdevices transferred from the transfer conveyor module 40 and feed the microdevices into the microdevice filling module 60, the curing module 70, and the encapsulation module 80 in sequence. The microdevice filling module 60, the curing module 70, the encapsulation module 80 and the substrate transportation module 90 are all disposed on the right side of the transfer conveyor module 40 in sequence from left to right and are respectively configured for filling, curing, encapsulating, and loading and unloading.

Figure 2:
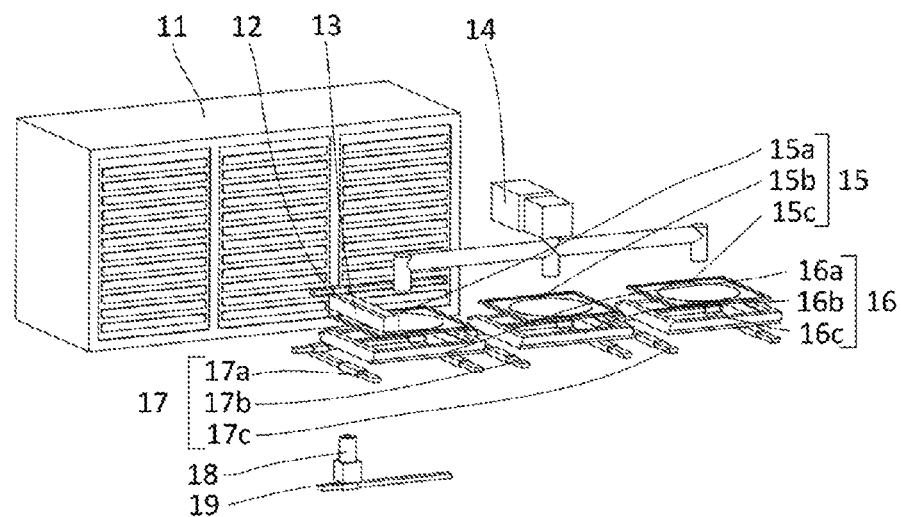
FIG. 2 is a schematic diagram of a structure of a microdevice stripping transfer module.

As shown in FIG. 2, the microdevice stripping transfer module 10 includes an automatic wafer plate changing unit 11, a laser scan movement unit 12, a transfer laser scan unit 13, a transfer laser stripping unit 14, a wafer plate movement unit 17 and a scan visual unit 18. The automatic wafer plate changing unit 11 is arranged behind the wafer plate movement unit 17 and is configured to install a wafer plate 15 (the wafer plate is adhered with a wafer, which is a microdevice) onto a wafer plate tray 16 above the wafer plate movement unit 17. The transfer laser scan unit 13 and the transfer laser stripping unit 14 are arranged above the wafer plate 15 and are respectively configured to weaken a bonding strength between the microdevices on the wafer plate and the wafer plate and to strip the microdevices from the wafer plate. The scan visual unit 18 is located below the wafer plate 15 and is configured to detect the quality of the microdevices and identify defective microdevices. During the subsequent stripping process, the transfer laser stripping unit 14 only strips functional microdevices. The scan visual unit 18 is connected to a visual movement unit 19 to implement the movement of the scan visual unit 18. The wafer plate movement unit 17 is configured to implement the movement of the wafer plate tray 16 and of the wafer plate 15 on the wafer plate tray 16. The transfer laser scan unit 13 is connected to the laser scan movement unit 12 to implement the movement of the transfer laser scan unit.

Figure 3:
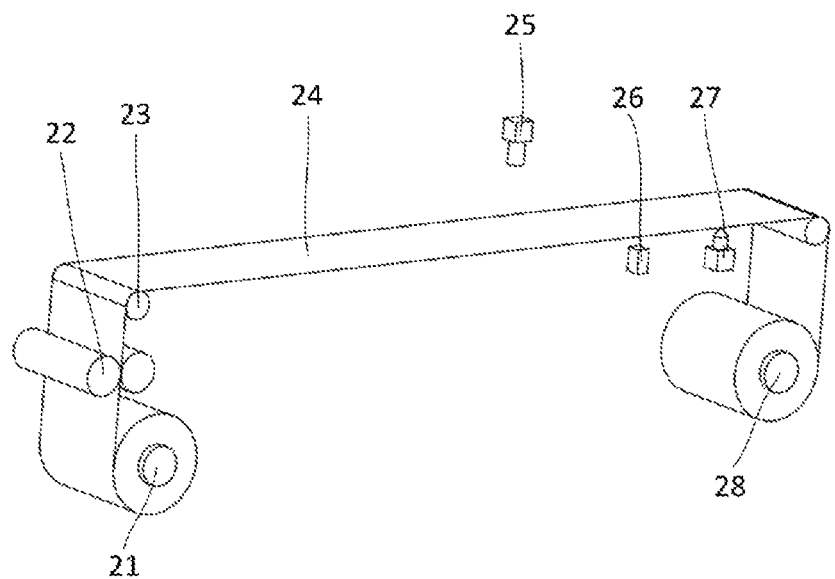
FIG. 3 is a schematic diagram of a structure of an auxiliary conveyor module.

As shown in FIG. 3, the auxiliary conveyor module 20 includes an auxiliary unwinding roll 21, driven rollers 22, an idle roller 23, an auxiliary conveyor 24, an auxiliary visual unit 25, an auxiliary laser scan unit 26, an auxiliary laser stripping unit 27 and an auxiliary winding roll 28. The auxiliary conveyor 24 has two ends wound around the auxiliary unwinding roll 21 and the auxiliary winding roll 28. The surface of the auxiliary conveyor 24 has a glue layer to implement the stable adhesion of the microdevices. The auxiliary conveyor 24 cooperates with the microdevice stripping transfer module 10, so that the microdevices are evenly arranged on the auxiliary conveyor 24. The auxiliary unwinding roll 21, the driven rollers 22, the idle roller 23, the auxiliary conveyor 24, the auxiliary visual unit 25, the auxiliary laser scan unit 26, the auxiliary laser stripping unit 27, and the auxiliary winding roll 28 are arranged in sequence along the feeding direction of the auxiliary conveyor 24 in space. The driven rollers 22 are located on two sides of the auxiliary conveyor 24 and are configured to drive the auxiliary conveyor 24 to feed. The idle roller 23 is located below the auxiliary conveyor 24 and is configured to support the auxiliary conveyor 24 and adjust the span layout of the auxiliary conveyor 24. There are specifically two idle rollers 23, so that the auxiliary conveyor 24 is arranged according to the required layout. The auxiliary visual unit 25 is located above the auxiliary conveyor 24 and is configured to detect the operating speed of the auxiliary conveyor 24. The auxiliary laser scan unit 26 is located below the auxiliary conveyor 24 and is configured to weaken the bonding strength between the microdevices and the auxiliary conveyor 24 through laser ablation, and facilitate the transfer of the microdevices from the auxiliary conveyor. The auxiliary laser stripping unit 27 is located below the auxiliary conveyor 24 and is configured to strip the microdevices from the auxiliary conveyor 24.

Figure 4:
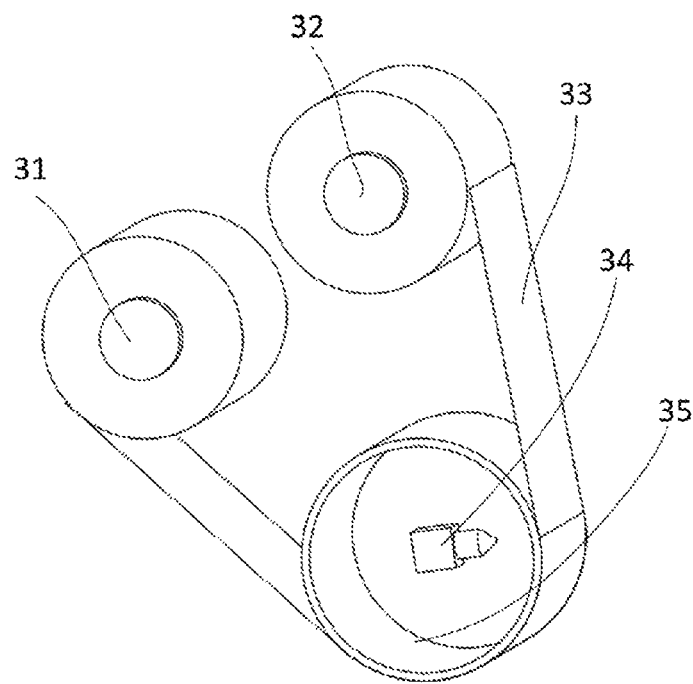
FIG. 4 is a schematic diagram of a structure of a transition conveyor module.

As shown in FIG. 4, the transition conveyor module 30 includes a transition unwinding roll 31, a transition winding roll 32, a transition roller 35, a transition conveyor 33 and a transition laser stripping unit 34. The transition roller 35 is located between the transition unwinding roll 31 and the transition winding roll 32. The transition conveyor 33 bypasses the transition roller 35 and has two ends wound around the transition unwinding roll 31 and the transition winding roll 32. The surface of the transition conveyor 33 has a glue layer. The transition laser stripping unit 34 is disposed in the transition roller 35 and is configured to emit laser to implement the stripping of the microdevices from the transition conveyor 33. The cylindrical surface of the transition roller 35 is designed with slits that allow the laser emitted by the transition laser stripping unit 34 to pass through. The lower part of the transition roller 35 is close to the auxiliary conveyor 24 and the right side is close to the transfer conveyor module 40 to implement the continuous picking up of the microdevices from the auxiliary conveyor 24. Then, the microdevices are transferred onto the transfer conveyor module 40.

Figure 5:
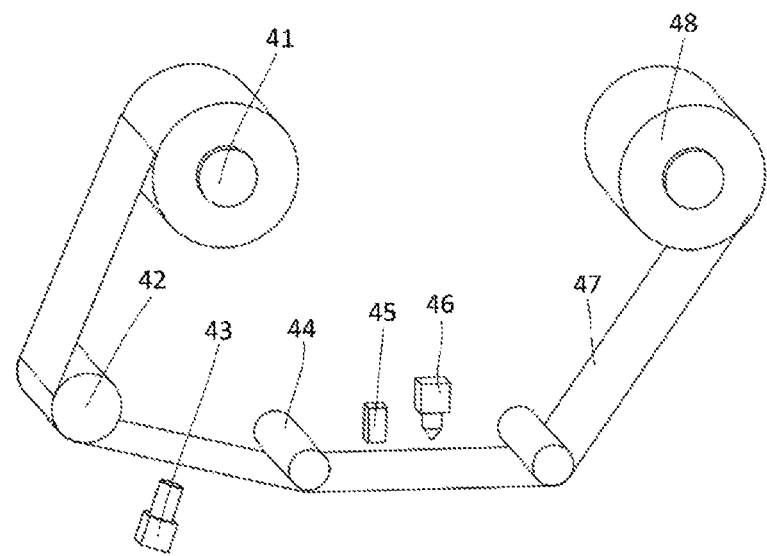
FIG. 5 is a schematic diagram of a structure of a transfer conveyor module.

As shown in FIG. 5, the transfer conveyor module 40 picks up the microdevices from the transition conveyor module 30 and cooperates with the substrate carrier module 50 to continuously transfer the microdevices to a substrate 55. The transfer conveyor module 40 includes a transfer unwinding roll 41, a transfer press roller 42, a transfer visual unit 43, a transfer idle roller 44, a transfer laser scan unit 45, a transfer laser stripping unit 46, a transfer conveyor 47 and a transfer winding roll 48. The transfer conveyor 47 has two ends wound around the transfer unwinding roll 41 and the transfer winding roll 48. The surface of the transfer conveyor 47 has a glue layer. The transfer unwinding roll 41, the transfer press roller 42, the transfer visual unit 43, the transfer idle roller 44, the transfer laser scan unit 45, the transfer laser stripping unit 46 and the transfer winding roll 48 are arranged in sequence along the feeding direction of the transfer conveyor 47 in space. The transfer press roller 42 is disposed above the transfer conveyor 47 and is configured to adjust the spacing between the transition conveyor 33 and the transfer conveyor 47 above the transition roller 35, so as to implement the stable transfer of the microdevices from the transition conveyor 33 to the transfer conveyor 47. The transfer visual unit 43 is disposed below the transfer conveyor 47 and is configured to detect the operating speed of the transfer conveyor 47. The transfer idle roller 44 is disposed above the transfer conveyor 47 and is configured to support the transfer conveyor 47 and adjust the span layout of the transfer conveyor 47. There are specifically two transfer idle rollers 44, so that the transfer conveyor 47 is arranged according to the required layout. The transfer laser scan unit 45 is disposed above the transfer conveyor 47 and is configured to weaken the bonding strength between the microdevices and the transfer conveyor 47. The transfer laser stripping module 46 is disposed above the transfer conveyor 47 and is configured to implement the stripping of the microdevices from the transfer conveyor 47.

Figure 6:
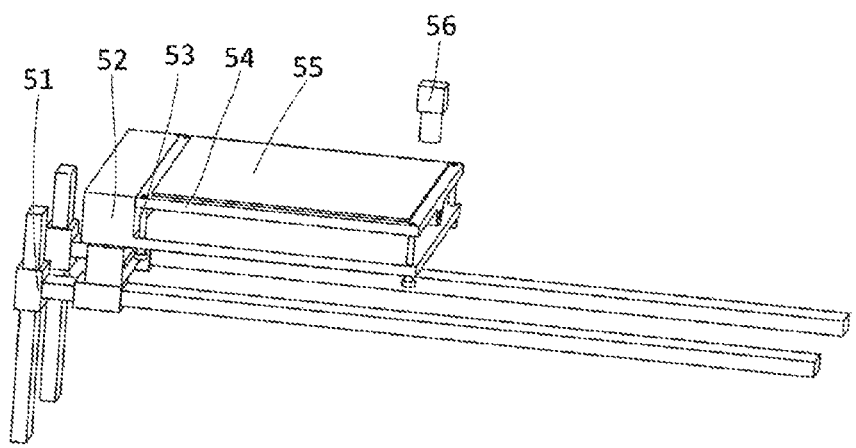
FIG. 6 is a schematic diagram of a structure of a substrate carrier module.

As shown in FIG. 6, the substrate carrier module 50 includes an XYZ module 51, a substrate base 52, an adjustment component 53, a substrate support 54 and a substrate visual unit 56. The substrate base 52 and the substrate support 54 are arranged in sequence from bottom to top above the XYZ module 51. The substrate base 52 is connected to the XYZ module 51. The substrate support 54 is connected to the substrate base 52 through the adjustment component 53. The substrate 55 is disposed on the substrate support 54 and is configured to receive the microdevices stripped from the transfer conveyor 47. The substrate visual unit 56 is disposed above the substrate 55 and is configured to implement the consistency detection of a microdevice array attached onto the substrate 55. Specifically, the substrate visual unit 56 detects the spacing between the microdevices stripped from the transfer conveyor 47 on the substrate 55 in real time, and compensates the spacing between adjacent microdevices on the substrate 55 in real time through adjusting the speed of the substrate 55 along the feeding direction of the transfer conveyor 47 to ensure that the microdevices are distributed at equal interval on the substrate 55. Specifically, the XYZ module 51 is configured to drive the three-way movement of the substrate 55, and the adjustment component 53 is configured to adjust the inclination angle of the substrate support 54.

Specifically, the microdevice filling module 60 fills positions on the substrate 55 without microdevices with microdevices and is preferred to adopt the conventional transfer process of picking up and placing the microdevices piece by piece, that is, to place the required microdevices on the positions without microdevices. The curing module 70 is configured to cure the solder on the substrate to ensure that the microdevices are physically connected to the substrate circuit and is preferred to adopt the UV curing process. The encapsulation module 80 is configured to encapsulate a protective layer over the connected microdevices and substrate circuit as a whole to isolate water and oxygen environment corrosion and is preferred to adopt the ink-jet printing thin-film encapsulation (TFE) process. The substrate transportation module 90 implements the loading and unloading of the substrate 55 before and after encapsulation.

Figure 7:
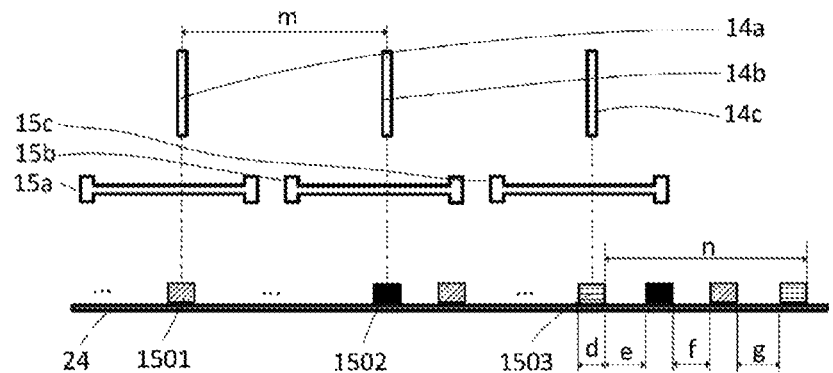
FIG. 7 is a calculation principle diagram of a laser beam spacing under an equal-interval chip arrangement according to the disclosure.

As shown in FIG. 2 and FIG. 7, the transfer laser unit 14 of the microdevice stripping transfer module 10 is preferred to simultaneously emit three independently controllable laser beams, which are respectively a first laser beam 14*a*, a second laser beam 14*b*, and a third laser beam 14*c*. The three laser beams are distributed at equal interval that is adjustable. The wafer plate 15 is preferred to include a first wafer plate 15*a*, a second wafer plate 15*b* and a third wafer plate 15*c*. The three wafer plates are distributed at equal interval. The three independently controllable laser beams respectively act on the three wafer plates. The first wafer plate 15*a* is installed with a first type microdevice 1501. The second wafer plate 15*b* is installed with a second type microdevice 1502. The third wafer plate 15*c* is installed with a third type microdevice 1503. The three types of microdevices have the same size specifications. The first type microdevice 1501, the second type microdevice 1502 and the third type microdevice 1503 are respectively three types of microdevices. The three types of microdevices are transferred onto the auxiliary conveyor under the action of the laser beams and are arranged at even interval. According to the process selection, the first type microdevice 1501, the second type microdevice 1502 and the third type microdevice 1503 may also be the same type of microdevices, which form a single microdevice array. The wafer plate tray 16 is preferred to include a first wafer plate tray 16*a*, a second wafer plate tray 16*b* and a third wafer plate tray 16*c*. The wafer plate movement unit 17 is preferred to include a first wafer plate movement unit 17*a*, a second wafer plate movement unit 17*b* and a third wafer plate movement unit 17*c*. The three wafer plate movement units all have independent degrees of freedom of XY movement in the plane.

As shown in FIG. 7, in order to implement the equal-interval arrangement of the first type microdevice 1501, the second type microdevice 1502, and the third type microdevice 1503 on the auxiliary conveyor 24, that is, allowing a spacing e of the second type microdevice 1502 and the third type microdevice 1503, a spacing f of the first type microdevice 1501 and the second type microdevice 1502, and a spacing g of the first type microdevice 1501 and the third type microdevice 1503 to be e=f=g, and setting the relevant parameters to satisfy the following formula:

$$\frac{m}{v+\Delta v} + t/3 = Z \times t$$

where, m is the spacing between adjacent laser beams of the three independently controllable laser beams of the microdevice stripping transfer module 10, v is the actual speed of the auxiliary conveyor 24 detected by the auxiliary visual unit 25, $\Delta v$ is the amount of speed fluctuation compensation of the auxiliary conveyor 24, t is the laser radiation interval (that is, the respective radiation interval of each laser beam) of the transfer laser stripping unit 14, and Z represents an integer and a value thereof is $\lceil m/((v+\Delta v)t)\rceil$.

Specifically, the uneven-interval distribution of the microdevices on the auxiliary conveyor 24 is compensated through controlling the trigger delay of the first laser beam 14*a* and the second laser beam 14*b*. The evenness of the microdevice interval is detected by the auxiliary visual unit 25. Using the third laser beam 14*c* as the benchmark, the adjustment of the trigger delay of the first laser beam 14*a* and the second laser beam 14*b* relative to the third laser beam 14*c* may be implemented through adjusting the amount of delay of the control pulse, so as to adjust the interval distribution of the microdevices on the auxiliary conveyor 24 to become even, and the amount of delay is preferred to be obtained from the following formula:

$$\begin{cases} n = (v+\Delta v)t \\ \Delta ta = \dfrac{n/3 - (d+g)}{v+\Delta v} \\ \Delta tb = \dfrac{2n/3 - (2d+g+f)}{v+\Delta v} \end{cases}$$

where, n is the spacing between same type of microdevices, v is the actual speed of the auxiliary conveyor 24 detected by the auxiliary visual unit 25, $\Delta v$ is the amount of speed fluctuation compensation of the auxiliary conveyor 24, g is the spacing between the first type microdevice 1501 and the third type microdevice 1503, e is the spacing between the second type microdevice 1502 and the third type microdevice 1503, f is the spacing between the first type microdevice 1501 and the second type microdevice 1502, d is the width of the microdevice, $\Delta ta$ is the amount of delay of the first laser beam 14*a*, $\Delta tb$ is the amount of delay of the second laser beam 14*b*, and t is the laser radiation interval of the transfer laser stripping unit 14.

Figure 8:
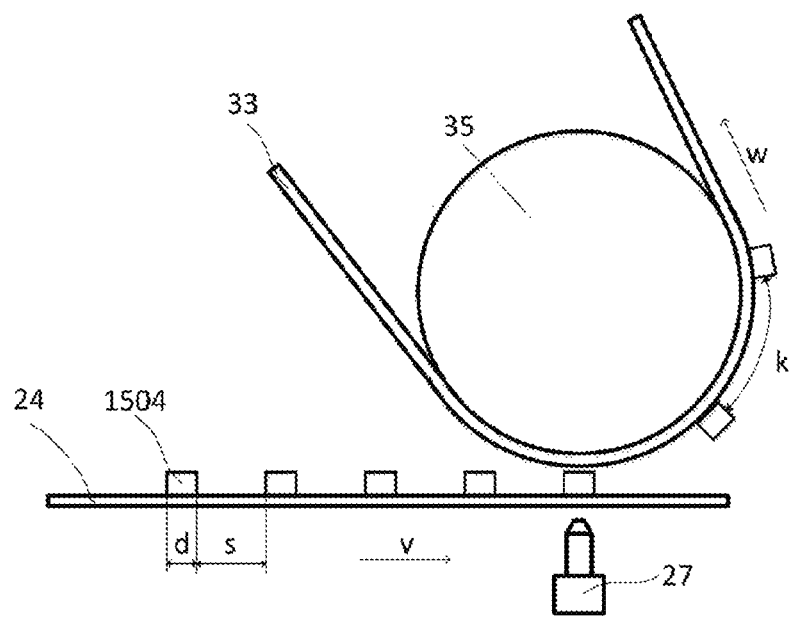
FIG. 8 is a calculation principle diagram of a microdevice spacing on a transition conveyor according to the disclosure.

Further, as shown in FIG. 8, the following formula is preferred to calculate the equal-interval spacing of each microdevice on the auxiliary conveyor 24:

$$s = \tfrac{1}{3}(v+\Delta v)t - d$$

where, s is the equal-interval spacing of each microdevice (the distances between two adjacent microdevices are all s) on the auxiliary conveyor 24, that is, s is the spacing of equal-interval microdevices 1504 on the auxiliary conveyor 24, and the equal-interval microdevice 1504 may be any one of the first type microdevice 1501, the second type microdevice 1502, and the third type microdevice 1503, v is the actual speed of the auxiliary conveyor 24 detected by the auxiliary visual unit 25, $\Delta v$ is the amount of speed compensation of the auxiliary conveyor 24, t is the laser radiation interval of the transfer laser stripping unit 14, and d is the width of the microdevice.

As shown in FIG. 8, the following formula is preferred to calculate the equal-interval spacing of each microdevice on the transition conveyor 30:

$$k = \frac{s+d}{v+\Delta v}(w+\Delta w) - d$$

where, k is the equal-interval spacing of each microdevice (the distances between two adjacent microdevices are all k) on the transition conveyor 33, s is the spacing of the equal-interval microdevices of the auxiliary conveyor 23, d is the width of the microdevice, v is the actual speed of the auxiliary conveyor 24 detected by the auxiliary visual unit 25, Δv is the amount of speed compensation of the auxiliary conveyor 24, w is the actual speed of the transition conveyor 33, and Δw is the amount of speed compensation of the transition conveyor 33.

Figure 9:
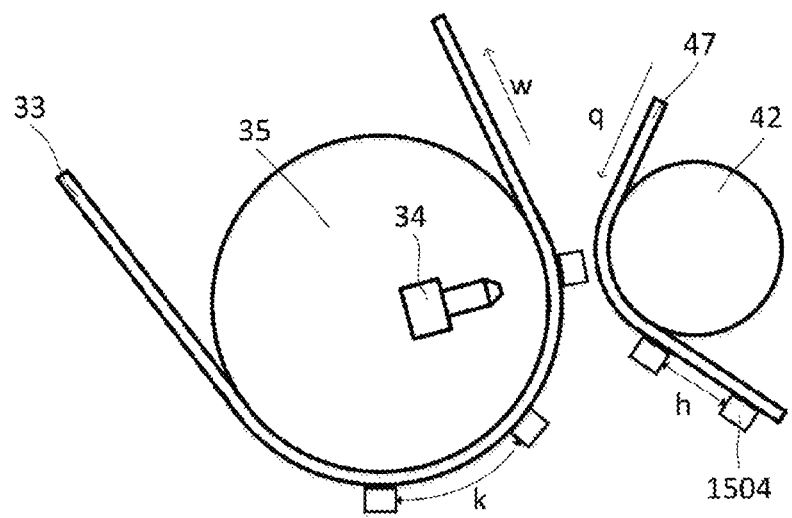
FIG. 9 is a calculation principle diagram of a microdevice spacing on a transfer conveyor according to the disclosure.

As shown in FIG. 9, the following formula is preferred to calculate the equal-interval spacing of each microdevice on the transfer conveyor 47:

$$h = \frac{k+d}{w+\Delta w}(q+\Delta q) - d$$

where, h is the equal-interval spacing of each microdevice (the distances between two adjacent microdevices are all h) on the transfer conveyor 47, k is the equal-interval spacing of each microdevice on the transition conveyor 33, d is the width of the microdevice, q is the speed of the transfer conveyor 47 detected by the transfer visual unit 43, Δq is the amount of speed compensation of the transfer conveyor 47, w is the actual speed of the transition conveyor 33, and Δw is the amount of speed compensation of the transition conveyor 33.

Figure 10:
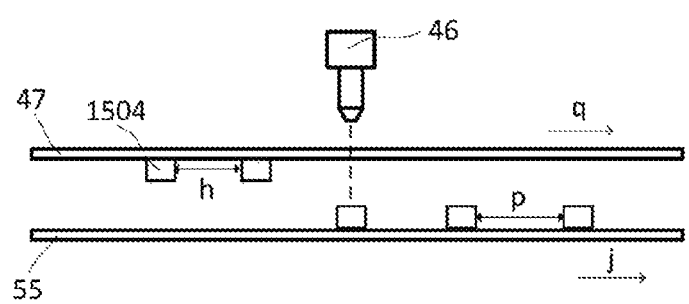
FIG. 10 is a calculation principle diagram of a microdevice spacing on a substrate according to the disclosure.
Figure 11:
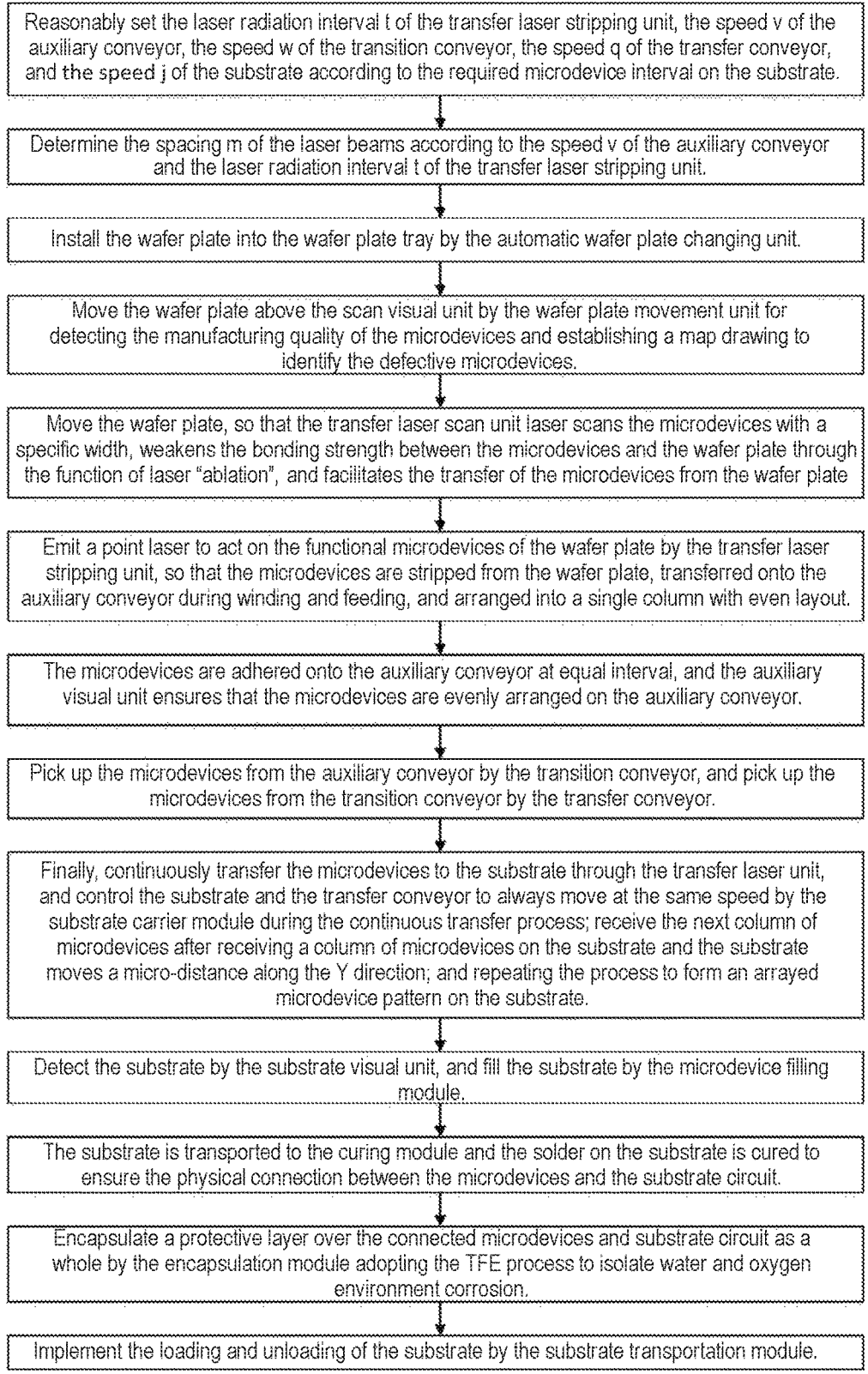
FIG. 11 is a flowchart of a laser stripping mass-transfer method for a microdevice based on a winding process according to the disclosure.

As shown in FIG. 10, the following formula is preferred to calculate the equal-interval spacing of each microdevice on the substrate 55:

$$p = \frac{h+d}{q+\Delta q}(j+\Delta j) - d$$

where, p is the equal-interval spacing of each microdevice (the distances between two adjacent microdevices are all p) on the substrate 55, h is the equal-interval spacing of each microdevice on the transfer conveyor 47, d is the width of the microdevice, q is the speed of the transfer conveyor 47 detected by the transfer visual unit 43, Δq is the amount of speed compensation of the transfer conveyor 47, j is the actual speed of the substrate 55 detected by the substrate visual unit 56, and Δj is the amount of speed compensation of the substrate 55.

The following describes the working process of the laser stripping mass-transfer device for the microdevice based on the winding process according to the disclosure, which includes the following steps.

Step S1: reasonably setting the laser radiation interval t of the transfer laser stripping unit 14, the speed v of the auxiliary conveyor 24, the speed w of the transition conveyor 33, the speed q of the transfer conveyor 47, and the speed j of the substrate 55 according to the required microdevice interval on the substrate 55, the transfer conveyor 47, the transition conveyor 33, and the auxiliary conveyor 24; and determining the spacing m of the laser beams according to the speed v of the auxiliary conveyor 24 and the laser radiation interval t of the transfer laser stripping unit 14.

Step S2: installing the wafer plate 15 into the wafer plate tray 16 by the automatic wafer plate changing unit 11; and moving the wafer plate 15 above the scan visual unit 18 by the wafer plate movement unit 17 for detecting the manufacturing quality of the microdevices and establishing a map drawing to identify the defective microdevices.

Step S3: moving the wafer plate 15, so that the transfer laser scan unit 13 laser scans the microdevices with good quality, weakening the bonding strength between the microdevices and the wafer plate through laser ablation to facilitate the transfer of the microdevices from the wafer plate; and emitting a point laser to act on the microdevices of the wafer plate 15 by the transfer laser stripping unit 14, so that the microdevices with good quality are stripped from the wafer plate, transferred onto the auxiliary conveyor 24 during winding and feeding, and arranged into a single column with even layout. The microdevices are adhered onto the auxiliary conveyor 24 at equal interval. The spacing of the microdevices on the auxiliary conveyor 24 is detected in real time using the auxiliary visual unit 25, and the spacing information is fed back to the transfer laser stripping unit 14. The adjustment of the trigger delay of the first laser beam 14a and the second laser beam 14b relative to the third laser beam 14c is implemented through adjusting the amount of delay of the control pulse. The spacing of the microdevices is compensated to ensure that the microdevices are evenly arranged on the auxiliary conveyor 24.

Step S4: picking up the microdevices from the auxiliary conveyor 24 by the transition conveyor 33, and picking up the microdevices from the transition conveyor 33 by the transfer conveyor 47; continuously transferring the microdevices from the transfer conveyor 47 to the substrate 55 through the transfer laser unit 46, and controlling the substrate 55 and the transfer conveyor 47 to always move at the same speed by the substrate carrier module 50 during the continuous transfer process; receiving the next column of microdevices after receiving a column of microdevices on the substrate 55 and the substrate 55 moves a distance, specifically moving along the Y direction (horizontal back and forth movement, perpendicular to the feeding direction of the transfer conveyor 47) for a micro-distance; and repeating the process to form an arrayed microdevice pattern on the substrate 55.

Step S5: detecting the substrate 55 through the substrate visual unit 56 to determine whether there is a lack of microdevices on the substrate, and if so, filling the substrate by the microdevice filling module 60; implementing a reliable connection between the microdevices and the substrate using the curing module 70; then encapsulating a protective layer over the connected microdevices and substrate as a whole using the encapsulation module 80; and finally implementing the unloading of the substrate by the substrate transportation module 90.

Those skilled in the art can easily understand that the above are only preferred embodiments of the disclosure and are not intended to limit the disclosure. Any modification, equivalent replacement, improvement, etc. made within the spirit and principle of the disclosure should be included in the protection scope of the disclosure.

What is claimed is:

1. A laser stripping mass-transfer device for microdevices based on a winding process, the laser stripping mass-transfer device comprising a microdevice stripping transfer module, an auxiliary conveyor module, a transition conveyor module, a transfer conveyor module, a substrate carrier module, a microdevice filling module, a curing module, an encapsulation module, and a substrate transportation module, wherein:

the microdevice stripping transfer module is located above a left side of the auxiliary conveyor module and is configured to implement detection and stripping of the microdevices;

the auxiliary conveyor module is configured to adhere the stripped microdevices, and then transfer the stripped microdevices onto the transition conveyor module;

the transition conveyor module is located above a right side of the auxiliary conveyor module and is configured to continuously pick up the microdevices from the auxiliary conveyor module and transfer the microdevices onto the transfer conveyor module;

the transfer conveyor module is located on a right side of the transition conveyor module and is configured to continuously pick up the microdevices from the transition conveyor module and transfer the microdevices onto the substrate carrier module;

the substrate carrier module is located below the transfer conveyor module and is configured to receive the microdevices transferred from the transfer conveyor module and feed the microdevices into the microdevice filling module, the curing module and the encapsulation module in sequence;

the microdevice filling module, the curing module, the encapsulation module, and the substrate transportation module are all disposed on a right side of the transfer conveyor module in sequence from left to right and are respectively configured for filling, curing, encapsulating and loading and unloading; and wherein the stripped microdevices have an equal-interval spacing on the auxiliary conveyor module, the transition conveyor module, the transfer conveyor module, and the substrate carrier module.

2. The laser stripping mass-transfer device for the microdevices based on the winding process according to claim 1, wherein the microdevice stripping transfer module comprises an automatic wafer plate changing unit, a laser scan movement unit, a transfer laser scan unit, a transfer laser stripping unit, a wafer plate movement unit and a scan visual unit, the automatic wafer plate changing unit is arranged behind the wafer plate movement unit and is configured to install a wafer plate into a wafer plate tray above the wafer plate movement unit, the transfer laser scan unit and the transfer laser stripping unit are arranged above the wafer plate and are respectively configured to weaken a bonding strength between the microdevices on the wafer plate and the wafer plate and strip the microdevices from the wafer plate, the transfer laser scan unit is connected to the laser scan movement unit, and the scan visual unit is located below the wafer plate and is configured to detect quality of the microdevices and identify defective microdevices.

3. The laser stripping mass-transfer device for the microdevices based on the winding process according to claim 1, wherein the auxiliary conveyor module comprises an auxiliary unwinding roll, driven rollers, an idle roller, an auxiliary conveyor, an auxiliary visual unit, an auxiliary laser scan unit, an auxiliary laser stripping unit and an auxiliary winding roll, two ends of the auxiliary conveyor are respectively wound around the auxiliary unwinding roll and the auxiliary winding roll, a surface of the auxiliary conveyor has a glue layer to implement stable adhesion of the microdevices, and cooperates with the microdevice stripping transfer module, so that the microdevices are evenly arranged on the auxiliary conveyor, the auxiliary unwinding roll, the driven rollers, the idle roller, the auxiliary visual unit, the auxiliary laser scan unit, the auxiliary laser stripping unit and the auxiliary winding roll are arranged in sequence along a feeding direction of the auxiliary conveyor, wherein the driven rollers are located on two sides of the auxiliary conveyor and are configured to drive the auxiliary conveyor to feed, the idle roller is located below the auxiliary conveyor and is configured to support the auxiliary conveyor and adjust a span layout of the auxiliary conveyor, the auxiliary visual unit is located above the auxiliary conveyor and is configured to detect an operating speed of the auxiliary conveyor, the auxiliary laser scan unit is located below the auxiliary conveyor and is configured to weaken a bonding strength between the microdevices and the auxiliary conveyor, and the auxiliary laser stripping unit is located below the auxiliary conveyor and is configured to strip the microdevices from the auxiliary conveyor.

4. The laser stripping mass-transfer device for the microdevices based on the winding process according to claim 1, wherein the transition conveyor module comprises a transition unwinding roll, a transition winding roll, a transition roller disposed between the transition unwinding roll and the transition winding roll, a transition conveyor, and a transition laser stripping unit, wherein the transition conveyor bypasses the transition roller and has two ends wound around the transition unwinding roll and the transition winding roll, a surface of the transition conveyor has a glue layer, the transition laser stripping unit is disposed in the transition roller and is configured to emit laser to implement stripping of the microdevices from the transition conveyor, a cylindrical surface of the transition roller is designed with slits that allow the laser emitted by the transition laser stripping unit to pass therethrough, a lower part of the transition roller is adjacent to the auxiliary conveyor and a right side of the transition roller is adjacent to the transfer conveyor module to implement continuous picking up of the microdevices from the auxiliary conveyor, and the microdevices are then transferred onto the transfer conveyor module.

5. The laser stripping mass-transfer device for the microdevices based on the winding process according to claim 1, wherein the transfer conveyor module comprises a transfer unwinding roll, a transfer press roller, a transfer visual unit, a transfer idle roller, a transfer laser scan unit, a transfer laser stripping unit, a transfer conveyor and a transfer winding roll, wherein the transfer conveyor has two ends wound around the transfer unwinding roll and the transfer winding roll, a surface of the transfer conveyor has a glue layer, the transfer unwinding roll, the transfer press roller, the transfer visual unit, the transfer idle roller, the transfer laser scan unit, the transfer laser stripping unit and the transfer winding roll are arranged in sequence along a feeding direction of the transfer conveyor, the transfer press roller is disposed above the transfer conveyor and is configured to adjust a spacing between the transition conveyor and the transfer conveyor, so as to implement a stable transfer of the microdevices from the transition conveyor to the transfer conveyor, the transfer visual unit is disposed below the transfer conveyor and is configured to detect an operating speed of the transfer conveyor, the transfer idle roller is disposed above the transfer conveyor and is configured to support the transfer conveyor and adjust a span layout of the transfer conveyor, the transfer laser scan unit is disposed above the transfer conveyor and is configured to weaken a bonding strength between the microdevices and the transfer conveyor, and the transfer laser stripping module is disposed above the transfer conveyor and is configured to implement stripping of the microdevices from the transfer conveyor.

6. The laser stripping mass-transfer device for the microdevices based on the winding process according to claim 1, wherein the substrate carrier module comprises an XYZ module configured to drive three-way movement of a substrate, a substrate base, an adjustment component, a substrate support and a substrate visual unit, wherein the substrate base is arranged on the XYZ module, the substrate support is connected to the substrate base through the adjustment component, the substrate is disposed on the substrate support and is configured to receive the microdevices stripped from the transfer conveyor, and the substrate visual unit is disposed above the substrate and is configured to implement consistency detection of a microdevice array attached onto the substrate.

7. The laser stripping mass-transfer device for the microdevices based on the winding process according to claim 2, wherein the transfer laser stripping unit of the microdevice stripping transfer module simultaneously emits three independently controllable laser beams, which are respectively a first laser beam, a second laser beam and a third laser beam, and the three laser beams are distributed at equal interval being adjustable; the wafer plate comprises a first wafer plate, a second wafer plate, and a third wafer plate, the three wafer plates are distributed at equal interval, the three independently controllable laser beams respectively act on the three wafer plates, the first wafer plate is installed with a first type microdevice, the second wafer plate is installed with a second type microdevice, the third wafer plate is installed with a third type microdevice, three types of microdevices have same size specifications, the first type microdevice, the second type microdevice, and the third type microdevice are respectively the three types of microdevices, and the three types of microdevices are transferred onto the auxiliary conveyor under action of the laser beams and form the equal-interval spacing; the wafer plate tray comprises a first wafer plate tray, a second wafer plate tray and a third wafer plate tray; and the wafer plate movement unit comprises a first wafer plate movement unit, a second wafer plate movement unit and a third wafer plate movement unit, and the three movement units have independent degrees of freedom of XY movement in a plane.

8. The laser stripping mass-transfer device for the microdevices based on the winding process according to claim 7, wherein the equal-interval spacing of the first type microdevice, the second type microdevice and the third type microdevice on the auxiliary conveyor module is ensured through following formula:

$$\frac{m}{v+\Delta v} + t/3 = Zt$$

where, m is a spacing between adjacent laser beams of the three independently controllable laser beams of the microdevice stripping transfer module, v is an actual speed of the auxiliary conveyor module detected by the auxiliary visual unit, $\Delta v$ is an amount of speed fluctuation compensation of the auxiliary conveyor module, t is a laser radiation interval of the transfer laser stripping unit, and Z represents an integer and a value thereof is $\lceil m/((v+\Delta v)t) \rceil$; and an uneven-interval distribution of the microdevices on the auxiliary conveyor module is compensated through controlling trigger delay of the first laser beam and the second laser beam, and an amount of delay is obtained from following formula:

$$\begin{cases} n = (v+\Delta v)t \\ \Delta ta = \dfrac{n/3 - (d+g)}{v+\Delta v} \\ \Delta tb = \dfrac{2n/3 - (2d+g+f)}{v+\Delta v} \end{cases}$$

where, n is a spacing between same type of microdevices, v is the actual speed of the auxiliary conveyor module detected by the auxiliary visual unit, $\Delta v$ is the amount of speed fluctuation compensation of the auxiliary conveyor module, g is a spacing between the first type microdevice and the third type microdevice, f is a spacing between the first type microdevice and the second type microdevice, d is a width of the microdevice, $\Delta ta$ is an amount of delay of the first laser beam, $\Delta tb$ is an amount of delay of the second laser beam, and t is the laser radiation interval of the transfer laser stripping unit.

9. The laser stripping mass-transfer device for the microdevices based on the winding process according to claim 7, wherein the equal-interval spacing of each microdevice on the auxiliary conveyor module is calculated by following formula:

$$s = \frac{1}{3}(v+\Delta v)t - d$$

where, s is the equal-interval spacing of each microdevice on the auxiliary conveyor module, v is an actual speed of the auxiliary conveyor module detected by the auxiliary visual unit, $\Delta v$ is an amount of speed compensation of the auxiliary conveyor module, t is a laser radiation interval of the transfer laser stripping unit, and d is a width of the microdevice;

the equal-interval spacing of each microdevice on the transition conveyor module is calculated by following formula:

$$k = \frac{s+d}{v+\Delta v}(w+\Delta w) - d$$

where, k is the equal-interval spacing of each microdevice on the transition conveyor module, s is a spacing of equal-interval microdevices of the auxiliary conveyor module, d is the width of the microdevice, v is the actual speed of the auxiliary conveyor module detected by the auxiliary visual unit, $\Delta v$ is the amount of speed compensation of the auxiliary conveyor module, w is an actual speed of the transition conveyor module, and $\Delta w$ is an amount of speed compensation of the transition conveyor module;

the equal-interval spacing of each microdevice on the transfer conveyor module is calculated by following formula:

$$h = \frac{k+d}{w+\Delta w}(q+\Delta q) - d$$

where, h is the equal-interval spacing of each microdevice on the transfer conveyor module, k is the equal-interval spacing of each microdevice on the transition conveyor module, d is the width of the microdevice, q is a speed of the transfer conveyor module detected by the transfer visual unit, Δq is an amount of speed compensation of the transfer conveyor module, w is the actual speed of the transition conveyor module, and Δw is the amount of speed compensation of the transition conveyor module; and the equal-interval spacing of each microdevice on the substrate carrier module is calculated by following formula:

$$p = \frac{h+d}{q+\Delta q}(j+\Delta j) - d$$

where, p is the equal-interval spacing of each microdevice on the substrate carrier module, h is the equal-interval spacing of each microdevice on the transfer conveyor module, d is the width of the microdevice, q is the speed of the transfer conveyor module detected by the transfer visual unit, Δq is the amount of speed compensation of the transfer conveyor module, j is an actual speed of the substrate detected by the substrate visual unit, and Δj is an amount of speed compensation of the substrate.

\* \* \* \* \*